United States Patent [19]
Takebe et al.

[11] Patent Number: 5,861,621
[45] Date of Patent: Jan. 19, 1999

[54] PHOTOSENSOR CIRCUIT HAVING AN INITIAL SETTING UNIT

[75] Inventors: Katsuhiko Takebe, Wako; Hiroshi Abe, Atsugi, both of Japan

[73] Assignee: Honda Giken Kabushiki Kaisha, Tokyo, Japan

[21] Appl. No.: 925,852

[22] Filed: Sep. 9, 1997

[30] Foreign Application Priority Data

Sep. 10, 1996 [JP] Japan .................................. 8-239503

[51] Int. Cl.⁶ .................................................. H01J 40/14
[52] U.S. Cl. ...................... 250/214 R; 348/297; 257/290
[58] Field of Search ............................ 250/214 R, 214.1, 250/208.1; 348/297–299; 257/290–292

[56] References Cited

U.S. PATENT DOCUMENTS 4,839,735  6/1989  Kyomasu et al. ...................... 257/290

*Primary Examiner*—Que T. Le
*Attorney, Agent, or Firm*—Lyon & Lyon LLP

[57] ABSTRACT

A photosensor circuit comprises a photoelectric transducer, an n-channel MOS transistor and an initial setting unit for precluding the occurrence of a residual image phenomenon. When an optical signal is generated by the photoelectric transducer, the initial setting unit sets the gate voltage of the n-channel MOS transistor at a high value for a predetermined time to lower the drain-source impedance of the n-channel MOS transistor to thereby control charge or discharge of a capacitor connected to a source terminal.

4 Claims, 8 Drawing Sheets

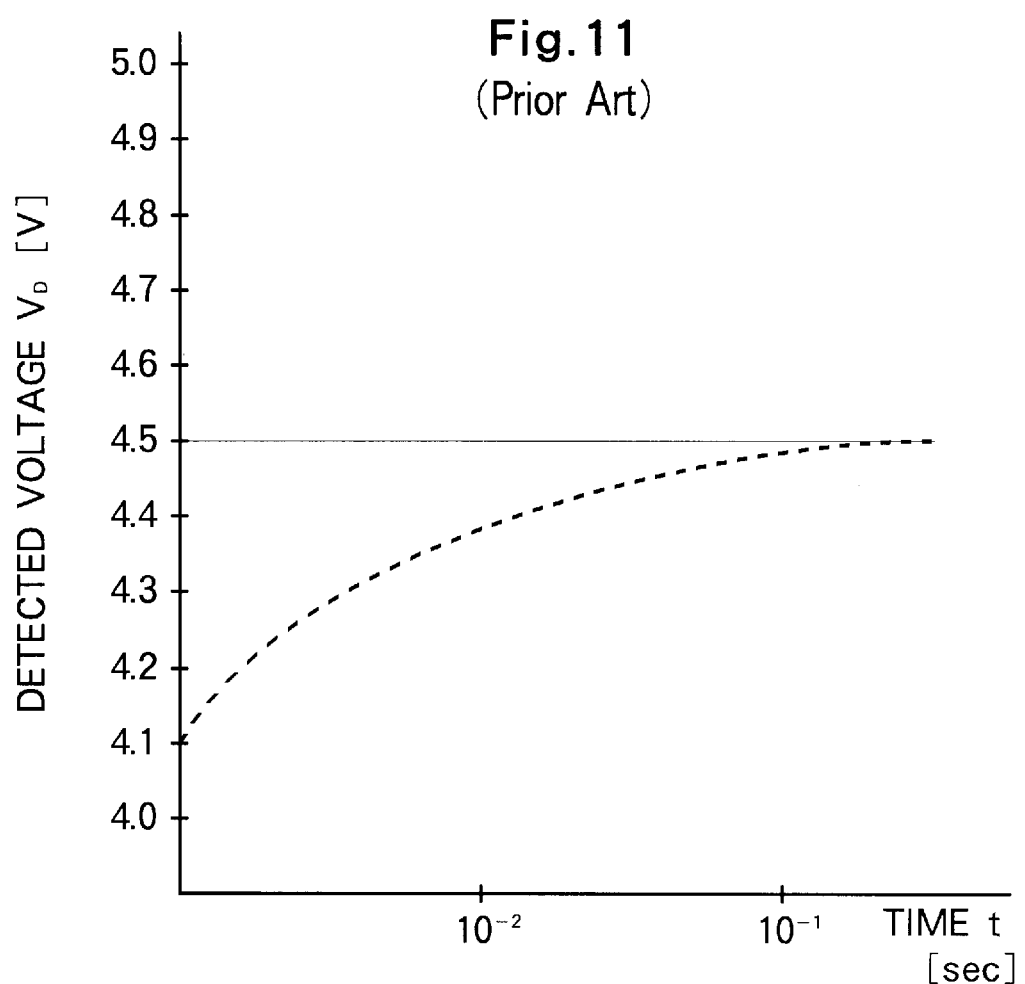

PHOTOSENSOR CIRCUIT HAVING AN INITIAL SETTING UNIT

BACKGROUND OF THE INVENTION

1. Field of the Invention

The present invention relates generally to a photosensor circuit for detecting a sensor output corresponding to the intensity of light (illumination), and more particularly to a photosensor circuit having a wide dynamic range and high sensitivity in detection of the intensity of light.

2. Description of the Related Art

A photosensor circuit is known which comprises a photodiode (PD) for detecting a sensor current corresponding to the intensity of light (optical signal), and a resistance load R for converting the sensor current detected by the PD into a detected voltage varying linearly with the sensor current. Thus, the known photosensor circuit detects light intensity (optical signal) as a sensor output in the form of voltage.

One example of such known photosensor circuit is shown here in FIG. 8. As shown in this figure, the known photosensor circuit is comprised of a photodiode PD, an operational amplifier OP, and a resistor R. The photodiode PD converts an optical signal $L_S$ into a sensor current $I_D$ whose intensity is proportional to the intensity of the optical signal $L_S$. The operational amplifier OP amplifies the sensor current $I_D$ to a predetermined gain under load of the resistor R and outputs a sensor output (detected voltage $V_D$) proportional to the sensor current $I_D$. Thus, the optical signal $L_S$ first detected by the photodiode PD is eventually detected in the form of a detected voltage $V_D$ varying linearly with the optical signal $L_S$.

Another conventionally known photosensor circuit includes a photodiode (PD) for generating a sensor current corresponding to the intensity of light (optical signal), and a metal-oxide-semiconductor (MOS) transistor for converting the sensor current detected by the PD into a detected voltage varying logarithmically with the sensor current. Thus, the conventional photosensor circuit detects light intensity (optical signal) as a sensor output in the form of voltage.

One example of such conventional photosensor circuit is shown in FIG. 9. As shown in this figure, the photosensor circuit 10 is comprised of a photodiode PD, an n-channel MOS transistor Q1 connected in series with the photodiode PD, an n-channel MOS transistor Q2 having a gate connected to a junction point P (sensor detection terminal) between the photodiode PD and the n-channel MOS transistor Q1, and an n-channel MOS transistor Q3 connected in series with the n-channel MOS transistor Q2.

Connected to the junction point P is an equivalent capacitor C comprising a synthesized stray capacitance caused by the relative proximity of the photodiode PD, n-channel MOS transistor Q1, n-channel MOS transistor Q2 and wires interconnecting these parts, or a capacitor formed during the semiconductor fabrication process.

The photodiode PD detects an optical signal $L_S$ and converts it into a sensor current $I_D$ whose intensity is proportional to the intensity of the optical signal $L_S$.

The n-channel MOS transistor Q1 forms a load of the photodiode PD and converts the sensor current $I_D$ detected by the photodiode PD into a voltage so that a detected voltage $V_D$ is developed at the sensor detection terminal P.

The n-channel MOS transistor Q1 forms a MOS transistor load having a logarithmic property in a weakly inverted condition or state for a range in which the sensor current $I_D$ is small. Thus, by converting the sensor current $I_D$ detected by the photodiode PD into a detected voltage $V_D$ having a logarithmic characteristic (i.e., varying logarithmically with the sensor current $I_D$), the n-channel MOS transistor Q1 can logarithmically deal with variations of the sensor current $I_D$ over several figures or units and thus enlarges the dynamic range of a sensor output (detected voltage $V_D$) relative to an input (sensor current $I_D$).

The n-channel MOS transistor Q2 forms an output transistor and performs voltage-to-current conversion so that the detected voltage $V_D$ can be taken out from the photosensor circuit 10 in the form of a sensor current signal.

The n-channel MOS transistor Q3 forms a switch for selectively connecting and disconnecting the sensor current signal converted by the n-channel MOS transistor Q2, to and from an external circuit (not shown).

The photosensor circuit 10 of the foregoing construction operates as follows:

The n-channel MOS transistor Q1 has a drain D and a gate G both connected to a common power supply VD (5-volt, for example). When no optical signal $L_S$ is detected (i.e., when the photodiode PD is not operated), a charge current $I_J$ flows from the power supply VD through the n-channel MOS transistor Q1 to the capacitor C and thus charges the capacitor C. Accordingly, the detected voltage $V_D$ appearing at the sensor detection terminal P can rise only to a predetermined value near the power supply voltage VD. The predetermined voltage value represents the initial condition in which the photodiode PD detects no optical signal $L_S$.

The predetermined value of the detected voltage $V_D$ in the initial condition is set to a smaller value than the power supply voltage VD because as the detected voltage $V_D$ at the sensor detection terminal P increasing with the charge of the capacitor C approaches the power supply VD, a gate-source voltage $V_{GS}$ (equal to the drain-source voltage $V_{DS}$) of the n-channel MOS transistor Q1 is cut down to cause the drain-source impedance to increase rapidly to thereby reduce the charge current $I_J$.

While the photosensor circuit 10 is in the initial condition, the photodiode PD detects an optical signal $L_S$ whereupon a sensor current $I_D$ flows through the photodiode PD, and so the detected voltage $V_D$ at the sensor detection terminal P decreases from the predetermined value logarithmically as a function of the drain-source impedance of the n-channel MOS transistor Q1 as the optical signal $L_L$ increases.

Since the sensor current $I_D$ of the photodiode PD is proportional to the optical signal $L_D$, and since the detected voltage $V_D$ at the sensor detection terminal P is the product of the sensor current $I_D$ and drain-source impedance having a logarithmic characteristic, the optical signal $L_S$ can be detected by detecting an absolute value of the detected voltage $V_D$.

FIG. 10 is a graph showing the detected voltage ($V_D$) versus sensor current ($I_D$) characteristic curve of the above-mentioned conventional photosensor circuit 10.

As shown in FIG. 10, while the photosensor circuit 10 is in the initial condition (sensor current $I_D=10^{-12}$A), the detected voltage $V_D$ has a predetermined value of 4.5V. When the sensor current $I_D$ increases over five figures up to $10^{-7}$, the detected voltage $V_D$ becomes 4.2V.

Thus, the photosensor circuit 10 is able to detect a five-figures (one hundred thousand-fold) change in the optical signal $L_S$ by only a 0.3V change in the detected voltage $V_D$ and, hence, provides a wide dynamic range relative to the input of the optical signal $L_S$.

However, in the conventional photosensor circuit shown in FIG. 8, detected voltages $V_D$ corresponding to optical signals $L_S$ are detected in linear characteristic. Accordingly, when the range of the optical signals $L_S$ to be detected is wide (such as five figures), the detected voltage $V_D$ becomes saturated due to restriction by the source voltage, making it difficult to increase or widen the dynamic range of the photosensor circuit.

In the case of the photosensor circuit 10 shown in FIG. 9, when the photodiode PD fails to detect the optical signal $L_S$ it is cut off to cause the charge current $I_J$ to flow into the capacitor C, thereby increasing the detected voltage $V_D$ appearing at the sensor detection terminal P. In this instance, however, due to a sudden increase in the drain-source impedance of the n-channel MOS transistor Q1 previously described, the detected voltage $V_D$ cannot exceed the predetermined value (see FIG. 10).

FIG. 11 is a graph showing the detected voltage ($V_D$) versus time (t) characteristic curve of the conventional photosensor circuit 10 shown in FIG. 9.

As evidenced from FIG. 11, the detected voltages $V_D$ shows a sudden rise relative to the time t lapsed after the cutoff of the photodiode PD until it approaches a predetermined value (detected voltage $V_D$=4.5). Thereafter, the detected voltage $V_D$ does not show a further increase from the predetermined value of 4.5V even when the time goes by.

Accordingly, when the photosensor circuit is employed in an indicator in which a plurality of such photosensor circuit are arranged in a matrix pattern to form a photosensor array, a difficulty arises in that due to a relatively long response time is required for the detected voltage $V_D$ to reach the predetermined value (4.5V), the indicator may hold a residual image over a relatively long period of time.

In the case of the conventional photosensor circuit 10, even in a range of the optical signal $L_S$ in which the optical signal $L_S$ has very small values (sensor current $I_S=10^{-12} - 10^{-11}$ A), the detected voltage $V_D$ shows a logarithmic characteristic, as shown in FIG. 10. It is, therefore, difficult to lower a value of the minimum detectable level of the very small optical signal $L_S$, resulting in a reduced sensor sensitivity.

Furthermore, since the n-channel MOS transistor Q1 and the capacitor C of the conventional photosensor circuit 10 jointly form a peak hold circuit against noises, a large-amplitude noise level can-be detected in error as an optical signal $L_S$, lowering the signal-to-noise (S/N) ratio of the photosensor circuit 10. As a result, the detectable minimum level of illumination (intensity of light) increases, while sensitivity of the photosensor circuit is reduced.

SUMMARY OF THE INVENTION

In view of the foregoing, an object of the present invention is to provide a photosensor circuit which is free from generation of a residual image and has a considerably wide dynamic range.

In brief, the photosensor circuit according to the present invention is constructed to set a setting value of the detected voltage for a standby time at a value higher than a value corresponding to a minimum detectable optical signal level, thus precluding the generation of a residual image. Very small optical signals can be detected in a linear response region of the photosensor circuit, while larger optical signals are detected in a logarithmic response region of the photosensor circuit. Thus, the photosensor circuit has a considerably wide dynamic range which insures reliable detection of the very small optical signals as well as the large optical signals.

More specifically, according to a first aspect of the present invention, there is provided a photosensor circuit comprising: a photoelectric transducer for detecting an optical signal and providing a sensor current; an n-channel MOS transistor connected in series with the photoelectric transducer for converting the sensor current detected by the photoelectric transducer into a detected voltage having a logarithmic characteristic in a weakly inverted state; and an initial setting unit for, after detection of the optical signal by the photoelectric transducer, setting a gate voltage of the n-channel MOS transistor at a value higher than a predetermined value for a predetermined time to lower an impedance between a drain and a source of the n-channel MOS transistor to thereby control charge or discharge of a capacitor connected to a detection terminal disposed at a junction between the photoelectric transducer and the n-channel MOS transistor.

The photosensor circuit preferably has a linear response region in which the sensor current detected by the photoelectric transducer is a very small current below a predetermined value, and the detected voltage is proportional to a charge current or a discharge current of the capacitor, and a logarithmic response region in which the sensor current detected by the photoelectric transducer is a large current above the predetermined value, and the detected voltage has a logarithmic characteristic corresponding to a load dynamic characteristic of the n-channel MOS transistor.

According to a second aspect of the present invention, there is provided a photosensor circuit comprising: a photoelectric transducer for detecting an optical signal and providing a sensor current; a p-channel MOS transistor connected in series with the photoelectric transducer for converting the sensor current generated by the photoelectric transducer into a detected voltage having a logarithmic characteristic in a weakly inverted state; a switching p-channel MOS transistor connected in parallel with the p-channel MOS transistor; and an initial setting unit for, after detection of the optical signal by the photoelectric transducer, setting a gate voltage of the switching p-channel MOS transistor at a value lower than a predetermined value for a predetermined time to lower an impedance between a drain and a source of the switching p-channel MOS transistor to thereby control charge or discharge of a capacitor connected to a detection terminal disposed at a junction between the photoelectric transducer and the p-channel MOS transistor.

The photosensor circuit preferably has a linear response region in which the sensor current generated by the photoelectric transducer is a very small current below a predetermined value, and the detected voltage is proportional to a charge current or a discharge current of the capacitor, and a logarithmic response region in which the sensor current generated by the photoelectric transducer is a large current above the predetermined value, and the detected voltage has a logarithmic characteristic corresponding to a load dynamic characteristic of the p-channel MOS transistor.

The initial setting unit sets the gate voltage of the n-channel MOS transistor or the gate voltage of the p-channel MOS transistor at a higher value for a predetermined period of time to lower the drain-source impedance of the MOS transistor to thereby control charge or discharge of the capacitor such that a setting value of the detected voltage for the standby time is set at a value higher than the value corresponding to the minimum detectable optical signal level. With this arrangement, generation of a residual image can be avoided.

The above and other objects, features and advantages of the present invention will become more apparent from the following description when making reference to the detailed description and the accompanying sheets of drawings in which preferred structural embodiments incorporating the principles of the present invention are shown by way of illustrated examples.

BRIEF DESCRIPTION OF THE DRAWINGS

FIG. 11 is a graph showing the detected voltage ($V_D$) versus time (t) characteristic curve of the conventional photosensor circuit shown in FIG. 9.

DETAILED DESCRIPTION OF THE PREFERRED EMBODIMENTS

Certain preferred embodiments of the present invention will be described below in greater detail with reference to the accompanying drawings.

Figure 1:
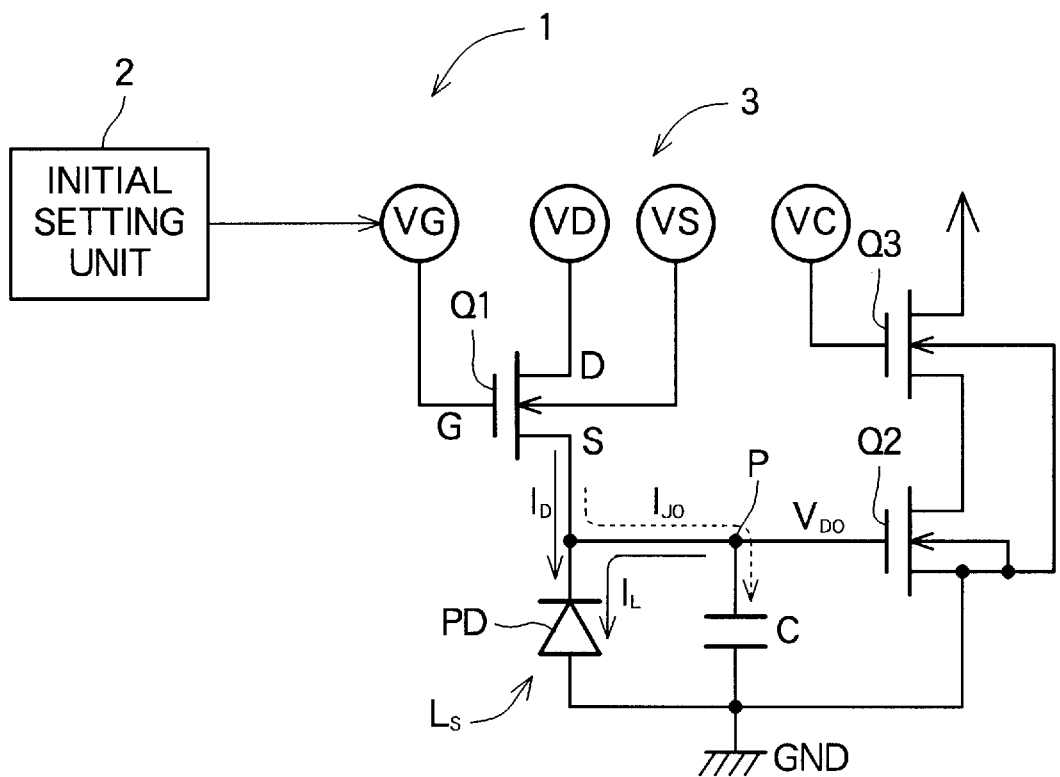
FIG. 1 is a circuit diagram showing a photosensor circuit using n-channel MOS transistors according to an embodiment of the present invention.

FIG. 1 shows, in circuit diagram, a photosensor circuit including n-channel MOS transistors according to a first embodiment of the present invention.

The photosensor circuit 1 generally comprises an initial setting unit 2 and a photosensor 3 electrically connected together. The photosensor 3 is composed of a photoelectric transducer such as a photodiode PD, an n-channel MOS transistor Q1 connected in series with the photodiode PD, an n-channel MOS transistor Q2 having a gate connected to a junction point P (sensor detection terminal) between the photodiode PD and the n-channel MOS transistor Q1, and an n-channel MOS transistor Q3 connected in series with the n-channel MOS transistor Q2.

An equivalent capacitor C comprising a synthesized stray capacitance caused by the relative proximity of the photodiode PD, the n-channel MOS transistor Q1, the n-channel MOS transistor Q2, and wires interconnecting these parts, or a capacitor formed during the semiconductor fabrication process is disposed between the sensor detection terminal P and the ground (GND).

The photodiode (photoelectric transducer) PD detects an optical signal $L_S$ and converts it into a sensor current $I_D$ whose intensity varies in proportion to changes in the optical signal $L_S$. The photoelectric transducer should by no means be limited to the photodiode PD but may include a phototransistor, a MOS transistor and so on.

The n-channel MOS transistor Q1 forms a load of the photodiode PD and converts the sensor current $I_D$ detected by the photodiode PD into a voltage to generate a detected voltage $V_D$ at the sensor detection terminal P.

The n-channel MOS transistor Q1 also forms a MOS transistor load having a logarithmic property in a weakly inverted condition or state for a range in which the sensor current $I_D$ is small, and converts the sensor current $I_D$ detected by the photodiode PD into a detected voltage $V_D$ having a logarithmic characteristic (namely, varying logarithmically as a function of the sensor current). The n-channel MOS transistor Q1 is able to logarithmically deal with changes in the sensor current $I_D$ over several figures, and thus widens the dynamic range of an output (detected voltage $V_D$) relative to an input (sensor current $I_D$).

The n-channel MOS transistor Q2 forms an output device and performs voltage-to-current conversion so that the detected volt $V_D$ can be taken out from the photosensor circuit 10 in the form of a sensor current signal. The n-channel MOS transistor Q3 forms a switch for selectively connecting and disconnecting the sensor current signal converted by the n-channel MOS transistor Q2, relative to an external circuit (not shown). The output device and the switch should by no means be limited to the n-channel MOS transistors Q2 and Q3 used in the illustrated embodiment but may include any other devices as long as they can form an output device and a switch.

Figure 2:
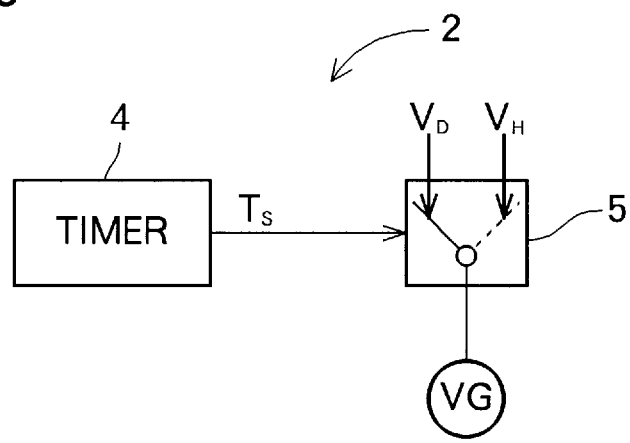
FIG. 2 is a block diagram showing a main portion of an initial setting unit of the photosensor circuit.

The initial setting unit 2 is connected to a gate G of the n-channel MOS transistor Q1. As shown in FIG. 2, the initial setting unit 2 is comprised of a timer 4 and a changeover switch 5 connected together to supply a gate voltage $V_G$ to the gate G of the n-channel MOS transistor Q1 of the photosensor 3 at two different values: one for an operating time of the photosensor 3 and the other for a standby time of the photosensor 3.

The timer 4 supplies the changeover switch 4 with a timer signal $T_S$ having a cycle period T (T1+T2) which is equal to the sum of an operating time T in which the photosensor 3 is able to detect an optical signal $L_S$, and a standby time T2 in which the photosensor 3 is standing by for subsequent detection of an optical signal $L_S$.

The changeover switch 5 is formed by an electronic switch, for example, and selects, based on the timer signal $T_S$ fed from the timer 4, either a drain voltage VD of the n-channel MOS transistor Q1, or a voltage VH of a value sufficiently higher than the drain voltage VD, so as to supply the selected voltage VD or VH as a gate voltage VG to the gate G of the n-channel MOS transistor Q1.

The gate voltage VG is set at the drain voltage VD for the operating time T1 of the timer signal $T_S$, while it is set at the high voltage VH for the standby time T2 of the timer signal $T_S$.

Figure 3:
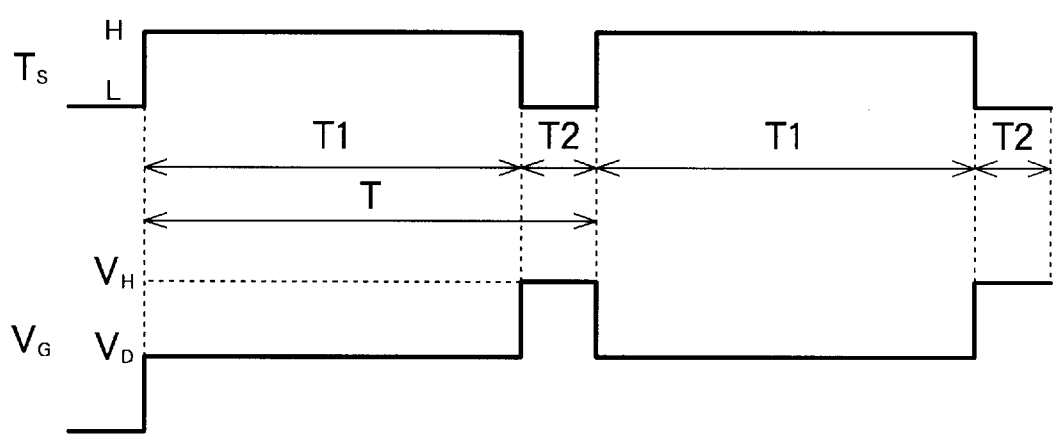
FIG. 3 is a time chart showing showing the relationship between a timer signal $T_S$ and a gate voltage VG of the initial setting unit.

FIG. 3 is a time chart showing the relationship between the timer signal $T_S$ and the gate voltage VG. As shown in this figure, the timer 4 supplies the changeover switch 5 with a high-level (H) timer signal $T_S$ for a relatively long operating time T1 in which an optical signal $L_S$ can be detected, and a low-level (L) timer signal $T_S$ for a relatively short standby time T2.

The changeover switch 5, as long as it receives the H-level timer signal $T_S$ (namely, for the operating time T1), selects the drain voltage VD and outputs it as a gate voltage VG.

Conversely, as long as it receives the L-level timer signal $T_S$ (namely, for the standby time T2), the changeover switch 5 selects the voltage VH sufficiently higher than the drain voltage DV and outputs it as a gate voltage VG.

The gate voltage VG selectively taking the value of the drain voltage VD for the time T1 and the value of the high voltage VH for the time T2 is output repeatedly at the cycle period T (T1+T2) so as to control the operation of the photosensor 3.

The photosensor circuit 1 of the foregoing construction operates as follows.

As shown in FIG. 3, when operation shifts from the operating time T1 in which an optical signal $L_S$ can be detected, to the standby time T2, the initial setting unit 2 (FIG. 1) starts supplying the gate G of the n-channel MOS transistor Q1 with a high voltage VH which is sufficiently higher than the drain voltage VD. With this application of the high voltage VH, an impedance between the drain D and the source S (drain-source impedance) of the the n-channel MOS transistor Q1 becomes low, thereby permitting a charge current $I_{JO}$ to flow into the capacitor C for charging the latter rapidly. As a consequence, the detected voltage $V_{D0}$ developed at the sensor detection terminal P rises up to a value (4.95V, for example) approximately equal to the power supply VD (drain voltage VD=5V, for example) in the time T2.

Further description will be given below with reference to the detected voltage ($V_{D0}$) versus time (t) characteristic curve shown in FIG. 4.

Figure 4:
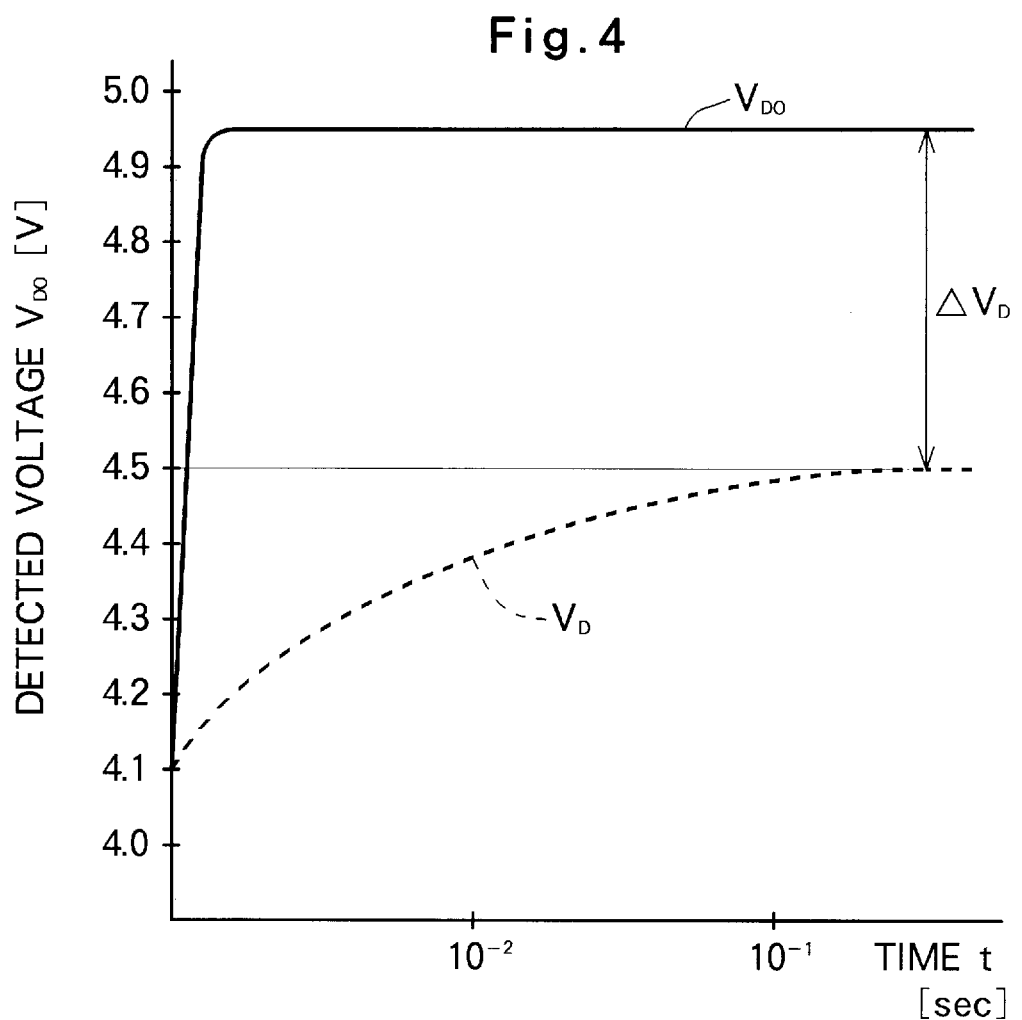
FIG. 4 is a graph showing the detected voltage ($V_{DO}$) versus time (t) characteristic curve of the photosensor circuit of the present invention.

As indicated by the solid line shown in FIG. 4, the detected voltage $V_{D0}$ rises sharply to a value almost equal to the power supply VD (5V) in a short period of time (1 ms or less).

Figure 9:
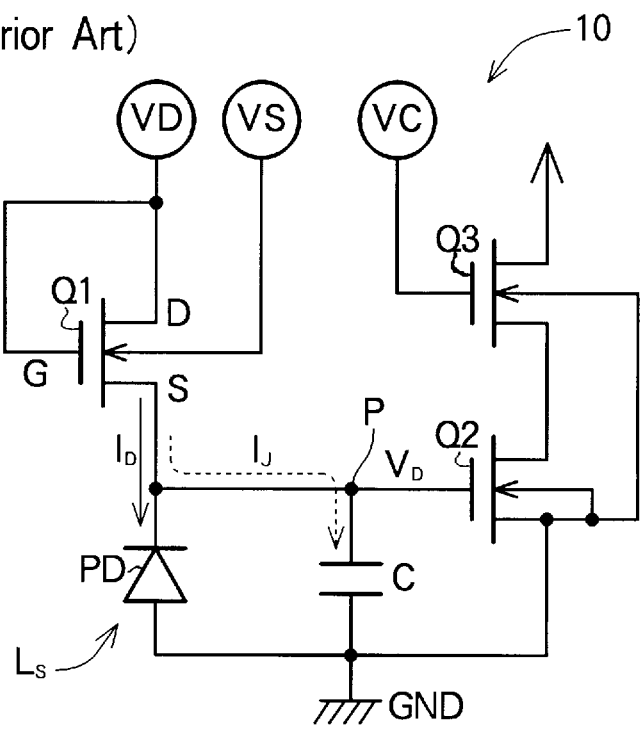
FIG. 9 is a circuit diagram showing another conventional photosensor circuit.
Figure 10:
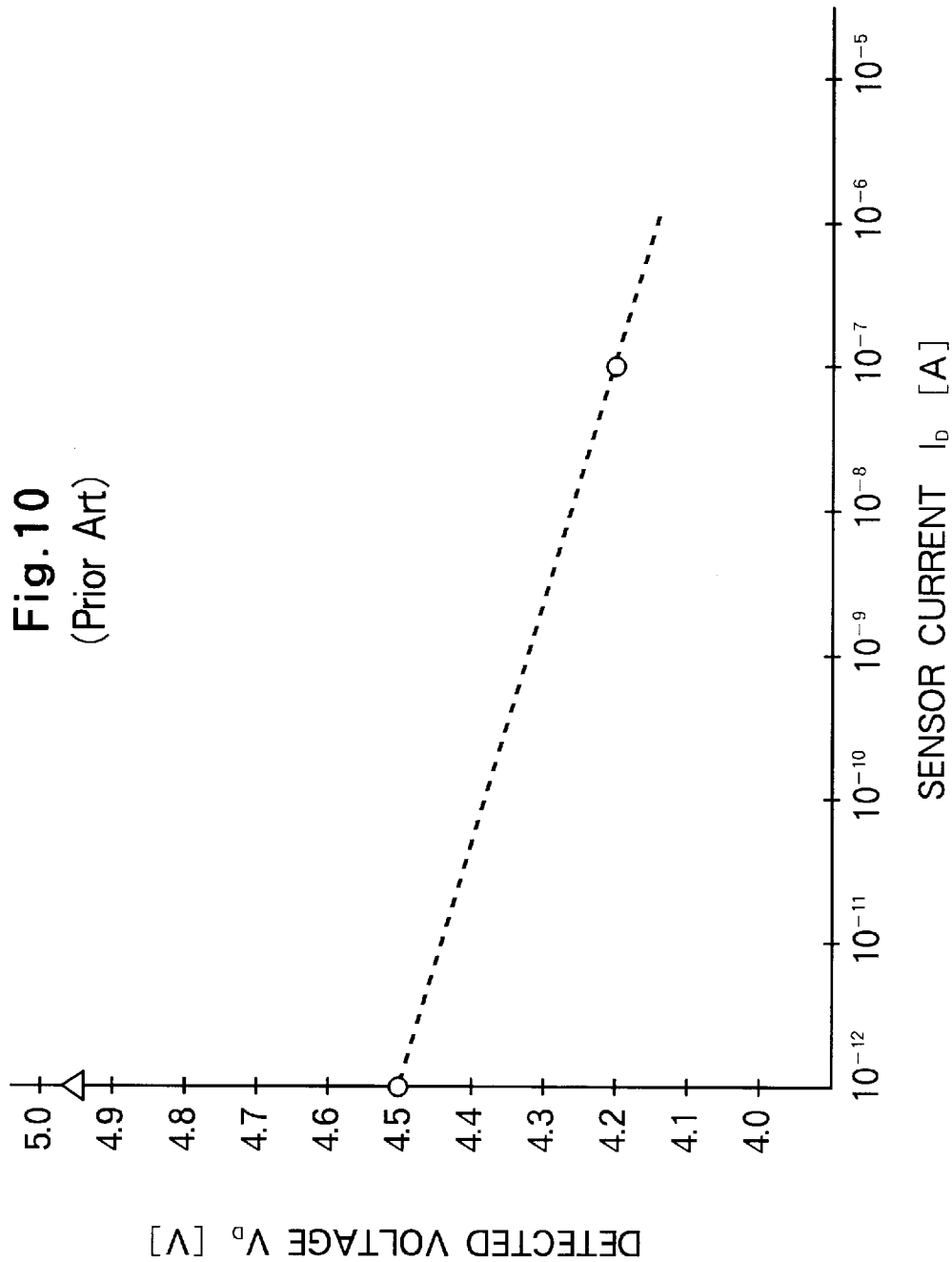
FIG. 10 is a graph showing the detected voltage ($V_{DO}$) versus sensor current ($I_D$) characteristic curve of the photosensor circuit shown in FIG. 9.

For the time T2, the detected voltage $V_{D0}$ (indicated by the solid line shown in FIG. 4) is initially set to a higher value (deviation $\Delta V_D = V_{D0} - V_D$) than the detected value $V_D$ (indicated by broken line shown in FIG. 4) of the conventional photosensor circuit 10 shown in FIG. 9.

A Accordingly, by shifting from the operation time T1 to the standby time T2, the detected voltage $V_{D0}$ immediately goes up to the value proximate to the power supply VD (5V). Since the detected voltage $V_{D0}$ can thus be set at a higher value than the maximum detectable level of the optical signal $L_S$, the photosensor circuit 1 of the present invention does not produce a residual image which would otherwise be caused when the initially setting value of the detected value $V_D$ is low such as one falling within within a range of the minimum detectable level of the optical signal $L_S$, as experienced in the case of the conventional photosensor circuit 10 shown in FIG. 9.

During the operating time T1, since noises are leveled or smoothed by an integral action of the capacitor C, the photosensor circuit 1 does never pick up or detect any noise as an optical signal $L_S$ even when it encounters an abrupt change in the noise level. Thus, the photosensor circuit 1 has a high signal-to-noise (S/N) ratio.

From this condition, the operation shifts to the operating time T1 shown in FIG. 3, whereupon the initial setting unit 2 (FIG. 1) supplies the drain voltage VD to the gate G of the n-channel MOS transistor Q1, causing the drain-source impedance to increase. Accordingly, in a range of the optical signal $L_S$ in which the optical signal $L_S$ is very small and hence the sensor current $I_D$ is small too, a discharge current $I_L$ released or discharged from the capacitor C becomes dominant in the sensor current $I_D$ over the current supplied from the n-channel MOS transistor Q1. Accordingly, a detected voltage $V_{D0}$ developed at the sensor detection terminal P decreases linearly with the discharge current $I_L$ and thus forms a linear response region.

As the sensor current $I_D$ of the photodiode PD increases with an increase in the optical signal $L_S$, the current supplied from the n-channel MOS transistor Q1 becomes dominant in the sensor current $I_D$. Accordingly, the detected voltage $V_{DO}$ developed at the sensor detection terminal P decreases logarithmically so as to form a logarithmic (log) response region in which the detected voltage $V_{D0}$ represents a value of a logarithmic characteristic corresponding to a load dynamic characteristic of the n-channel MOS transistor Q1.

Figure 5:
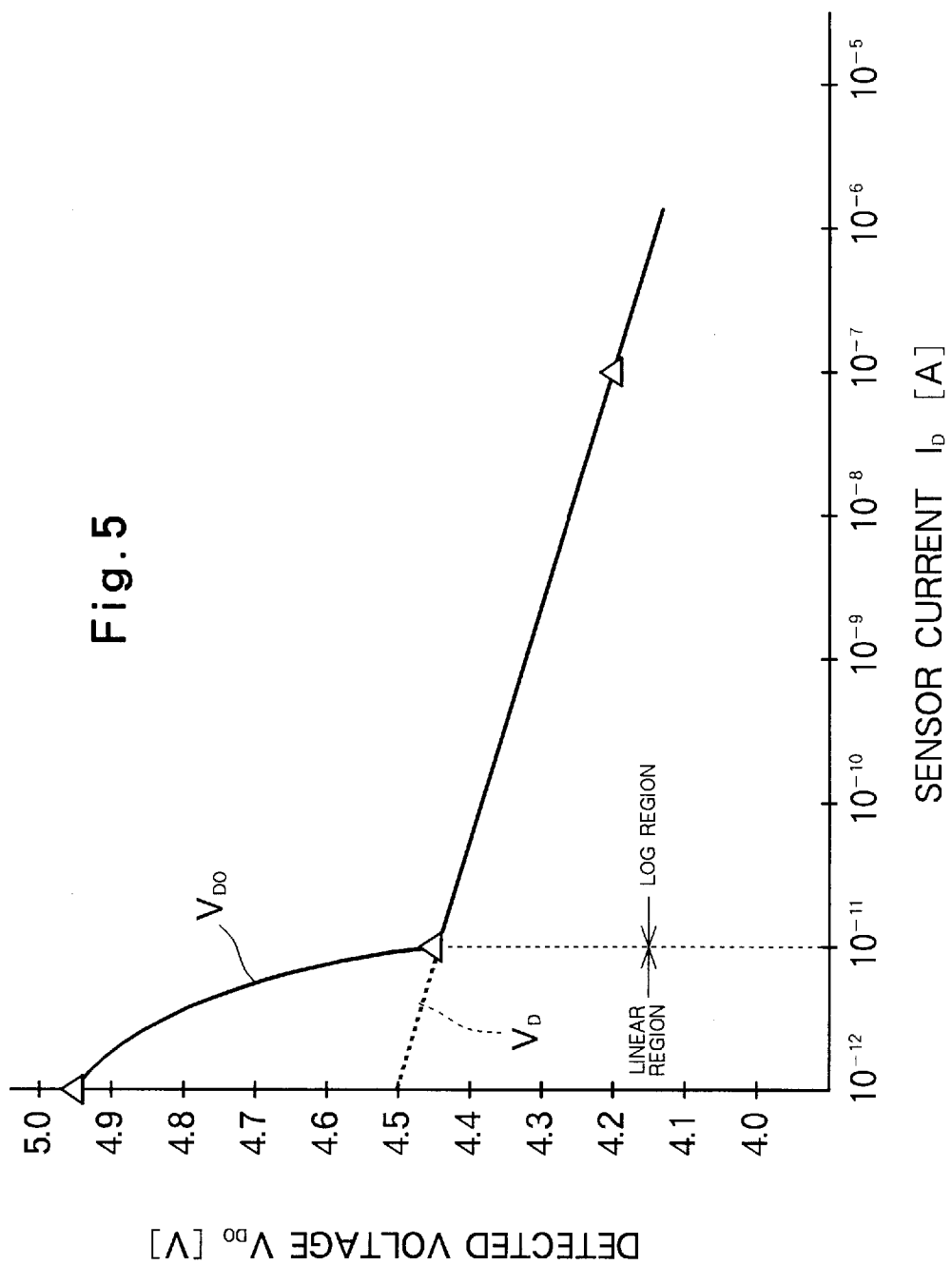
FIG. 5 is a graph showing the detected voltage ($V_{DO}$) versus sensor current ($I_D$) characteristic curve of the photosensor circuit of the present invention.

FIG. 5 shows the detected voltage ($V_{DO}$) versus sensor current ($I_D$) characteristic curve of the photosensor circuit 1 of the present invention.

As shown in FIG. 5, the detected voltage $V_{DO}$ forms, for very small sensor currents $I_D$ (ranging from $10^{-12}$A to $10^{-11}$A), the linear response region in which it decreases linearly with the change in the discharge current $I_L$ (FIG. 1) of the capacitor C and, for greater sensor currents $I_D$ (exceeding $10^{-11}$A), the log response region in which it decreases logarithmically in correspondence to the load dynamic characteristic of the n-channel MOS transistor Q1.

As opposed to the photosensor circuit 1 of the present invention, the photosensor circuit 10 shown in FIG. 9 does not form a linear response region for the very small sensor currents $I_D$ but forms a log response region as indicated by the solid-lined detected voltage $V_D$ shown in FIG. 5 because the gate voltage VG of the n-channel MOS transistor Q1 is always set at the drain voltage VD.

In FIG. 5, the detected voltage $V_{D0}$ changes its response region from the non-linear response region (log response region) to the linear response region, and vice versa at a point where the sensor current $I_D$ flowing in the photodiode PD is equal to the current flowing in the n-channel MOS transistor Q1 (in FIG. 5, the point corresponding to the sensor current $I_D = 10^{-11}$ A). The detected voltage $V_{D0}$ at this point is defined here as a load MOS limiting voltage of the load-forming n-channel MOS transistor Q1.

The photosensor circuit 1 is generally used in an indicator in which a plurality of such photosensor circuits 1 are arranged in a matrix pattern to form a photosensor array.

The photosensor circuit 1 of the present invention is able to set the detected voltage $V_{D0}$ for very small sensor currents $I_D$ to be variable in a wider range than the detected voltage $V_D$ in the conventional photosensor circuit 10 shown in FIG. 9. This means that the photosensor circuit 10 can detect very small optical signals $L_S$ with high resolution and thus has an improved degree of sensitivity.

Furthermore, by virtue of the wide variable range of the detected voltage $V_{D0}$ provided for very small sensor currents $I_D$, the photosensor circuit 1 has a wide dynamic range. In addition, since noises are leveled or smoothed by the integral action of the capacitor C, the S/N ratio of the photosensor circuit 1 is improved too.

Figure 6:
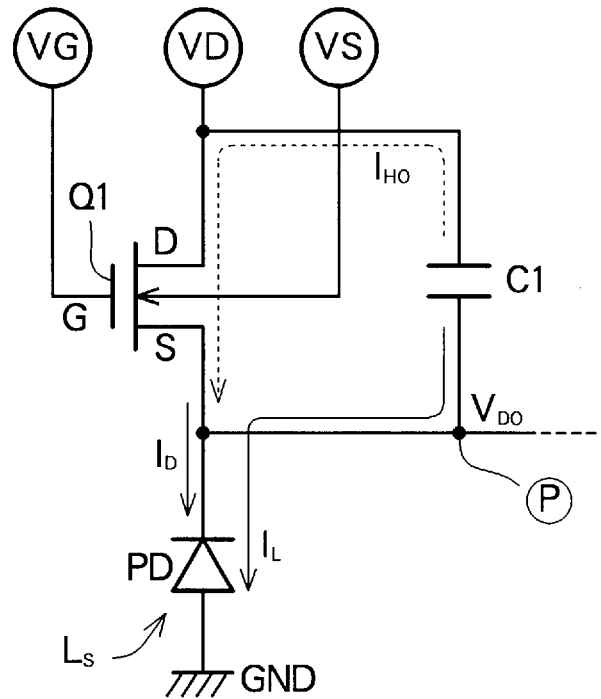
FIG. 6 is a circuit diagram showing a main portion of a photosensor circuit using an n-channel MOS transistor according to another embodiment of the present invention.

FIG. 6 shows, in circuit diagram, a main portion of a photosensor circuit incorporating therein an n-channel MOS transistor according to another embodiment of the present invention.

The photosensor circuit shown in FIG. 6 differs from the photosensor circuit shown in FIG. 1 in that a capacitor C comprising a synthesized stray capacitance or formed during the semiconductor fabrication process is disposed between a sensor detection terminal P and a power supply (VD).

With the photosensor circuit thus constructed, when operation is switched or changed from the operating time T1 to the standby time T2, such as shown in FIG. 3, it causes the n-channel MOS transistor Q1 to conduct, and so the drain-source impedance drops to a very small value. Thus, a discharge current $I_{H0}$ is permitted to flow from the capacitor C through the drain-source junction of the n-channel MOS transistor Q1 whereupon the detected voltage $V_{D0}$ rises up to a value (4.95V, for example) substantially equal to the power supply VD (drain voltage VD=5V, for example) in the same manner as represented by the characteristic curve shown in FIG. 4.

From this condition, the operation shifts to the operating time T1 (FIG. 3) whereupon in the linear response region in which the sensor current $I_D$ is very small, a charge current $I_L$ flowing in the photodiode PD via the capacitor C becomes dominant, while in the log response region in which the sensor current $I_D$ is relatively large, the current flowing in the n-channel MOS transistor Q1 becomes dominant. Thus, the detected voltage $V_{D0}$ developed at the sensor detection terminal P has substantially the same characteristics as shown in FIG. 5 relative to the sensor current $I_D$.

It is understood from the foregoing that the photosensor circuit having a capacitor C disposed between the sensor detection terminal P and the power supply (VD) has substantially the same performance characteristics as the photosensor circuit 1 in which a capacitor C is disposed between the sensor detection terminal P and the ground (GND), as shown in FIG. 1.

Figure 7:
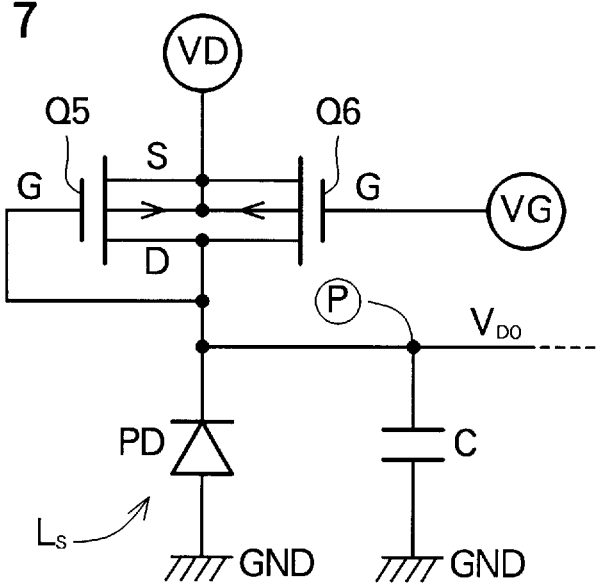
FIG. 7 is a circuit diagram showing a main portion of a photosensor circuit using a pair of parallel connected p-channel MOS transistors according to still another embodiment of the present invention.
Figure 8:
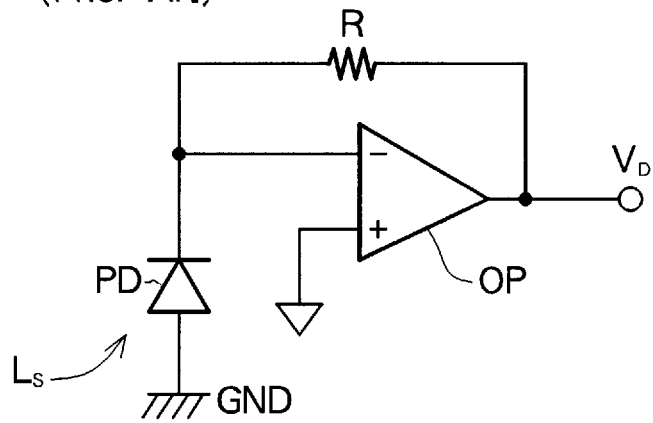
FIG. 8 is a circuit diagram showing a conventional photosensor circuit.

FIG. 7 shows in circuit diagram a main portion of a photosensor circuit incorporating therein p-channel MOS transistors according to a further embodiment of the present invention.

The photosensor circuit shown in FIG. 7 differs from the photosensor circuit of FIG. 1 in that two p-channel MOS transistors Q5 and Q6 are used in place of the n-channel MOS transistor Q1, and the gate voltage VG of the initial setting unit 2 (FIG. 2) is set at a low voltage VL instead of at the high voltage VH.

As shown in FIG. 7, the p-channel MOS transistor Q5 is connected in series with a photodiode PD so as to form a load of the photodiode PD. The p-channel MOS transistor Q6 used for switching purposes is connected in parallel with the p-channel MOS transistor Q5 so that the two p-channel MOS transistors Q5 and Q6 jointly form a load corresponding to one formed by the n-channel MOS transistor Q1 shown in FIG. 1. The switching p-channel MOS transistor Q6 has a gate G connected with the initial setting unit (not shown but identical to one 2 shown in FIGS. 1 and 2) so that a voltage $V_D$ equivalent to the source voltage and the aforesaid low voltage VL are selectively supplied as a gate voltage to the gate G of the the p-channel MOS transistor Q6 from the initial setting unit 2.

Throughout the operating time T1 shown in FIG. 3, the voltage VD corresponding to the source voltage is supplied to the gate of the p-channel MOS transistor Q6 so that the p-channel MOS transistor Q6 is held in an OFF condition. Conversely, during the standby time T2, the low voltage VL which is sufficiently lower than the drain voltage is supplied to the gate of the p-channel MOS transistor Q6 so that the p-channel MOS transistor Q6 is held in an ON condition.

Thus, in the operating time T1 the p-channel MOS transistor Q5 continuously forms a load having a logarithmic property in the same manner as the n-channel MOS transistor Q1 shown in FIG. 1, while in the standby time T2 the p-channel MOS transistor Q6 is held "ON", and so the source-train impedance is cut down. The photosensor circuit of FIG. 7 can, therefore, provide substantially the same performance characteristics as the photosensor circuit 1 shown in FIG. 1.

Like manner as done by the single n-channel MOS transistor Q1, the two parallel connected p-channel MOS transistors Q5, Q6 are also able to set a setting value of the detected voltage $V_{D0}$ for the standby time T2 at a higher level than a value corresponding to the minimum detectable optical signal level whereby the occurrence of a residual image can be avoided.

It may readily be appreciated that the same performance characteristics as described above can be attained even when the capacitor C shown in FIG. 7 is disposed between the sensor detection terminal P and the power supply (VD), such as shown in FIG. 6.

As described above, according to one preferred form of the present invention, a photosensor circuit includes an initial setting unit for, after detection of an optical signal by a photodiode (photoelectric transducer), setting the gate voltage of an n-channel MOS transistor at a high value for a predetermined time to lower a drain-source impedance of the n-channel MOS transistor to thereby control charge or discharge of a capacitor connected to a detection terminal disposed at a junction between the photodiode and the n-channel MOS transistor. With this arrangement, the setting value of the detected voltage for the standby time can be set at a higher value than a value corresponding to the minimum detectable optical signal level, and so the occurrence of a residual image can be avoided.

According to another preferred form of the present invention, a photosensor circuit includes an initial setting unit for, after detection of an optical signal by a photoelectric transducer, setting the gate voltage of a switching p-channel MOS transistor at a low value for a predetermined time to lower the drain-source impedance of the switching p-channel MOS transistor to thereby control charge or discharge of a capacitor connected to a detection terminal disposed at a junction between the photoelectric transducer and another p-channel MOS transistor which is connected in series with the photoelectric transducer and in parallel with the switching p-channel MOS transistor. In like manner as done by the n-channel MOS transistor, the parallel connected p-channel MOS transistors are also able to set the detected voltage for the standby time at a higher value than a value corresponding to the minimum detectable optical signal level with the result that the occurrence of a residual image can be avoided.

According to the present invention, the photosensor circuit has a linear response region and a logarithmic response region contiguous to the linear response region. In the linear response region, the sensor current detected by the photoelectric transducer is a very small current below a predetermined value, and the detected voltage is proportional to a charge current or a discharge current of said capacitor. In the logarithmic response region, the sensor current detected by said photoelectric transducer is a large current above the predetermined value, and the detected voltage has a logarithmic characteristic corresponding to a load dynamic characteristic of the MOS transistor.

The predetermined value of the sensor current is determined by the value of a sensor current obtained when the current flowing in the photoelectric transducer become equal to the current flowing in the MOS transistor.

In addition, since noises are leveled or smoothed by the integral action of the capacitor, the S/N ratio of the photosensor circuit is increased, allowing the minimum detectable optical signal level to be lowered. The sensitivity of the photosensor circuit can, therefore, be improved.

Obviously, various minor changes and modifications of the present invention are possible in the light of the above teaching. It is therefore to be understood that within the scope of the appended claims the invention may be practiced otherwise than as specifically described.

What is claimed is:

1. A photosensor circuit comprising:

a photoelectric transducer for detecting an optical signal and providing a sensor current;

an n-channel MOS transistor connected in series with said photoelectric transducer for converting the sensor current detected by said photoelectric transducer into a detected voltage having a logarithmic characteristic in a weakly inverted state; and an initial setting unit for, after detection of the optical signal by said photoelectric transducer, setting a gate voltage of said n-channel MOS transistor at a value higher than a predetermined value for a predetermined time to lower an impedance between a drain and a source of said n-channel MOS transistor to thereby control charge or discharge of a capacitor connected to a detection terminal disposed at a junction between said photoelectric transducer and said n-channel MOS transistor.

2. A photosensor circuit according to claim 1, wherein said photosensor circuit has a linear response region in which the sensor current generated by said photoelectric transducer is a very small current below a predetermined value, and the detected voltage is proportional to a charge current or a discharge current of said capacitor, and a logarithmic response region in which the sensor current generated by said photoelectric transducer is a large current above said predetermined value, and the detected voltage has a logarithmic characteristic corresponding to a load dynamic characteristic of said n-channel MOS transistor.

3. A photosensor circuit comprising:

a photoelectric transducer for detecting an optical signal and generating a sensor current;

a p-channel MOS transistor connected in series with said photoelectric transducer for converting the sensor current generated by said photoelectric transducer into a detected voltage having a logarithmic characteristic in a weakly inverted state;

a switching p-channel MOS transistor connected in parallel with said p-channel MOS transistor; and an initial setting unit for, after detection of the optical signal by said photoelectric transducer, setting a gate voltage of said switching p-channel MOS transistor at a value lower than a predetermined value for a predetermined time to lower an impedance between a drain and a source of said switching p-channel MOS transistor to thereby control charge or discharge of a capacitor connected to a detection terminal disposed at a junction between said photoelectric transducer and said p-channel MOS transistor.

4. A photosensor circuit according to claim 3, wherein said photosensor circuit has a linear response region in which the sensor current generated by said photoelectric transducer is a very small current below a predetermined value, and the detected voltage is proportional to a charge current or a discharge current of said capacitor, and a logarithmic response region in which the sensor current generated by said photoelectric transducer is a large current above said predetermined value, and the detected voltage has a logarithmic characteristic corresponding to a load dynamic characteristic of said p-channel MOS transistor.

* * * * *

UNITED STATES PATENT AND TRADEMARK OFFICE
CERTIFICATE OF CORRECTION

PATENT NO. : 5,861,621
DATED : January 19, 1999
INVENTOR(S) : Katsuhiko Takebe, et. al.

It is certified that error appears in the above-identified patent and that said Letters Patent is hereby corrected as shown below:

Column 3, line 45, please change "can-be" to -- can be --.

Column 6, line 36, please change "$V_G$" to -- VG --.

Column 7, line 40, please delete the "A" at the beginning of the paragraph.

Column 9, line 49, please change "$V_D$" to -- VD --.

Signed and Sealed this

Seventh Day of March, 2000

Attest:

Attesting Officer

Q. TODD DICKINSON

*Commissioner of Patents and Trademarks*